United States Patent
Lan et al.

(10) Patent No.: US 8,193,648 B2
(45) Date of Patent: Jun. 5, 2012

(54) METHOD FOR DETECTING ERRORS OF EXPOSED POSITIONS OF A PRE-LAYER AND A CURRENT LAYER BY AN INTEGRATED ALIGNMENT AND OVERLAY MARK

(75) Inventors: Yuan Ku Lan, Taoyuan County (TW); Chung-Yuan Lee, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 193 days.

(21) Appl. No.: 12/758,289

(22) Filed: Apr. 12, 2010

(65) Prior Publication Data
US 2011/0156285 A1   Jun. 30, 2011

(30) Foreign Application Priority Data
Dec. 30, 2009  (TW) .............................. 98145824 A

(51) Int. Cl.
*H01L 23/544* (2006.01)
*H01L 21/66* (2006.01)

(52) U.S. Cl. ........... 257/797; 257/E23.179; 257/E21.53; 438/16

(58) Field of Classification Search .................. 257/797, 257/E23.179, E21.53; 438/16
See application file for complete search history.

(56) References Cited

U.S. PATENT DOCUMENTS
7,742,026 B2 * 6/2010 Lee et al. ........................ 345/83
2003/0044057 A1 * 3/2003 Lan ............................... 382/145
* cited by examiner

*Primary Examiner* — A O Williams
(74) *Attorney, Agent, or Firm* — Rosenberg, Klein & Lee

(57) ABSTRACT

An integrated alignment and overlay mark for detecting the exposed errors of the photolithography process between a pre-layer and a current layer is disclosed. The integrated alignment and overlay mark includes an alignment mark and an overlay mark in the same shot region. The alignment mark is formed surrounding the overlay mark; therefore, the gap or the orientation between the pre-layer and the current layer can be calculated in order to check the alignment accuracy of photolithography process.

10 Claims, 6 Drawing Sheets

METHOD FOR DETECTING ERRORS OF EXPOSED POSITIONS OF A PRE-LAYER AND A CURRENT LAYER BY AN INTEGRATED ALIGNMENT AND OVERLAY MARK

BACKGROUND OF THE INVENTION

1. Field of the Invention

The present invention relates to an integrated alignment and overlay mark and the method for checking an alignment accuracy using the integrated alignment and overlay mark; especially, the present invention relates to an integrated mark having an alignment marks and an overlay mark exposed in the same shot region.

2. Description of Related Art

For determining the exposure alignment between layers on the wafer in the semiconductor manufacturing processes, there are alignment mark(s) and overlay mark(s) formed on the each layer so as to check the alignment by comparing the relative positions of the features of the marks.

However, the alignment mark and overlay mark are individually formed in different shot region (exposed area). In other words, the layer of the wafer has two individual marks, one is alignment mark and the other is overlay mark, formed thereon. Because the two individual marks are formed on the scribe lane, the scribe lane occupies the limited wafer area too much to manufacture efficiently semiconductor die on the wafer. In other words, the wafer area is not efficiently used due to the large scribe lane with the two individual marks thereon. Furthermore, the large scribe lane results in the small manufacturing window and the manufacturing yield cannot be highly promoted. On the other hand, in the view point of the material cost, the large scribe lane results in high cost of wafer material and the manufacturing benefit is decreased.

Furthermore, in comparison of the alignment mark and the overlay mark, engineer assumes that there is no error between the two marks. In practice, because that the two marks are formed in the different shot region, the error exists in the different exposed performance. Therefore, the analyzed result cannot precisely represent the alignment accuracy between the layers. In other words, the parameter of the exposure equipment cannot be precisely and correctly calibrated.

Consequently, with regard to the resolution of defects illustrated hereinbefore, the inventors of the present invention propose a reasonably designed solution for effectively eliminating such defects.

SUMMARY OF THE INVENTION

The objective of the present invention is to provide an integrated alignment and overlay mark which includes an alignment mark and an overlay mark in the same shot region (exposed region) so that there is no error between the alignment mark and an overlay mark in the same shot region. In other words, the alignment accuracy can be precisely analyzed. Furthermore, the alignment errors in different axis can be corrected.

Another objective of the present invention is reducing the kerf area (the area of the scribe lane) occupied by the individual alignment mark and the overlay mark. On the other hand, the wafer area can be efficiently used to manufacture the dies in order to increase the manufacturing benefit.

To achieve the objective described above, the present invention discloses an integrated alignment and overlay mark for checking an alignment accuracy of photolithography process between a pre-layer and a current layer. The integrated alignment and overlay mark includes an alignment mark and an overlay mark and the two kinds marks are formed in a same shot region. The overlay mark is formed inside the alignment mark, and the alignment mark is corresponding to the overlay mark in a predetermined axis, whereby errors of exposed positions of the pre-layer and the current layer is calculated by checking the alignment mark and the overlay mark.

The present invention further discloses a method for detecting errors of exposed positions of a pre-layer and a current layer by the integrated alignment and overlay mark. The method includes the step of: forming an alignment mark of the integrated alignment and overlay mark in a shot region on the pre-layer; forming an overlay mark of the integrated alignment and overlay mark in the same shot region on the current layer; and making measurements of orientation and/or gap between the alignment mark and the overlay mark for detecting errors of exposed positions of the pre-layer and the current layer.

The present invention provides beneficial effect that the alignment mark and the overlay mark are integrated in the same shot region so that the occupied area of the traditional, individual alignment mark and the overlay mark can be reduced. Moreover, the alignment accuracy can be precisely determined.

In order to further appreciate the characteristics and technical contents of the present invention, references are hereunder made to the detailed description and appended drawings in relation with the present invention. However, the descriptions and appended drawings are shown solely for exemplary purposes, with no intention that they be used to restrict the scope of the present invention.

DETAILED DESCRIPTION OF THE PREFERRED EMBODIMENTS

Figure 1:
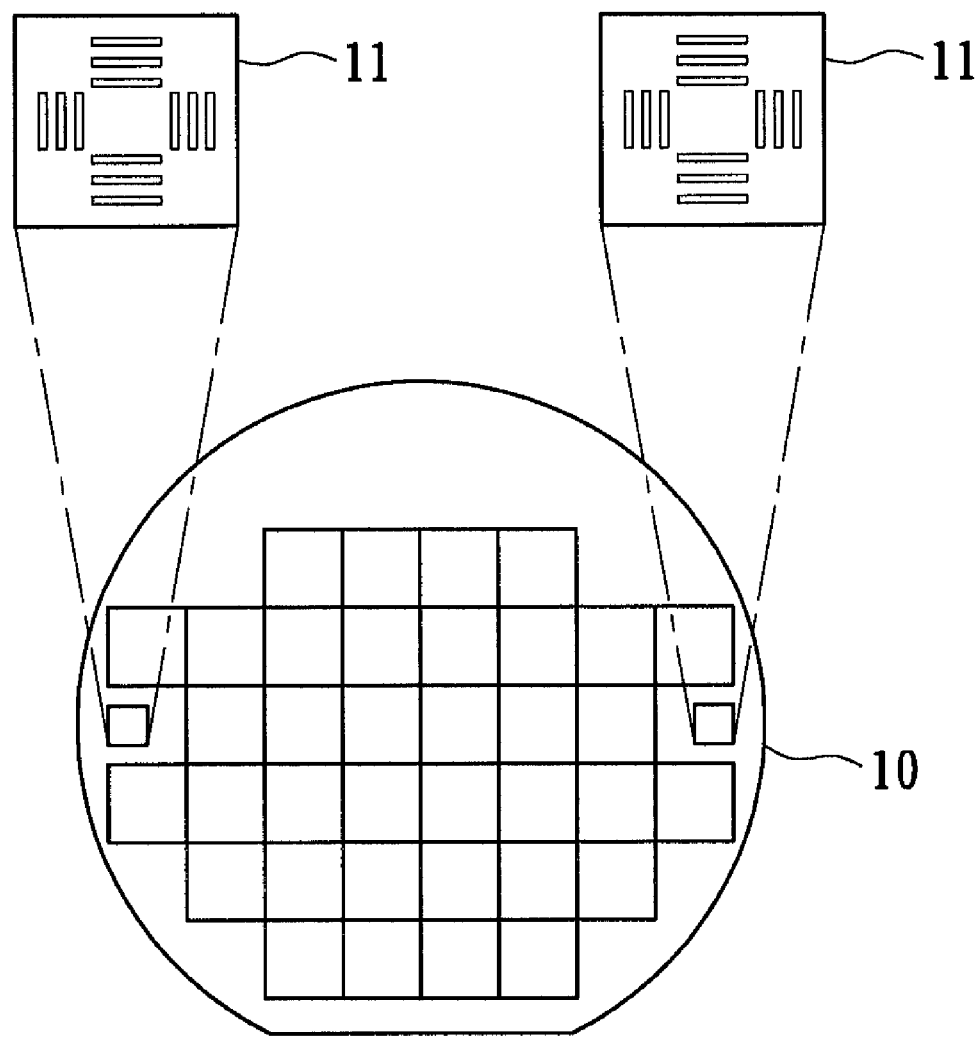
FIG. 1 is a diagram showing the exposed regions on a wafer.
Figure 1A:
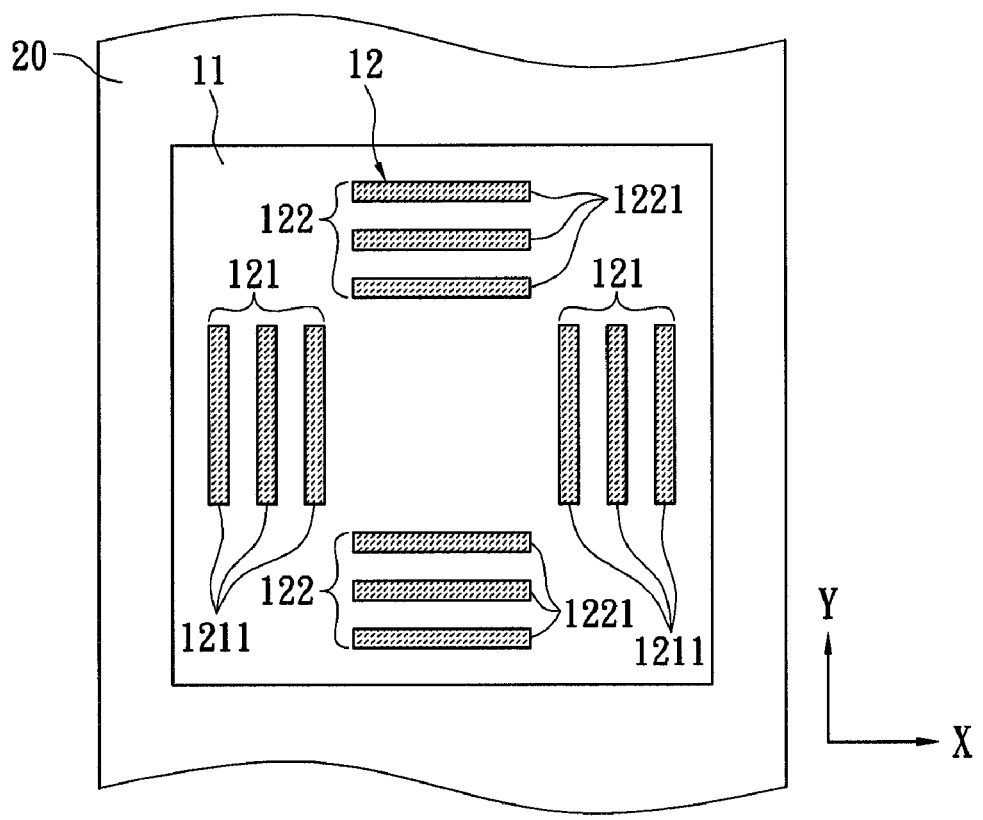
FIG. 1A showing the first embodiment of an alignment mark of the integrated alignment and overlay mark on the pre-layer according to the present invention.
Figure 1B:
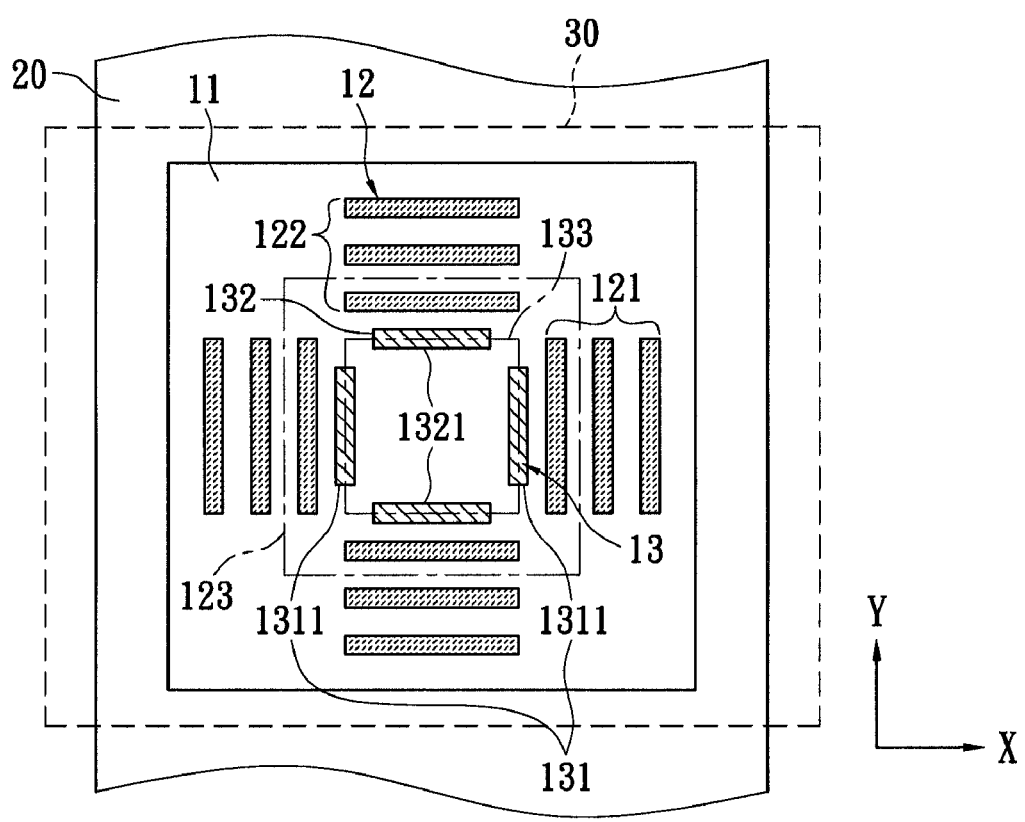
FIG. 1B showing the first embodiment of an overlay mark of the integrated alignment and overlay mark on the pre-layer according to the present invention.

Refer now to FIGS. 1 to 1B, which show the first embodiment of the present invention. The present invention provides an integrated alignment and overlay mark which integrates an alignment mark and an overlay mark in the same shot region for solving the problem that the limited space of wafer is occupied by the individual alignment marks and overlay marks. The integrated alignment and overlay mark of the present invention includes an alignment mark 12 and an overlay mark 13, and the two marks 12, 13 are formed in the same shot region 11. Further, the overlay mark 13 is formed inside the alignment mark 12. The alignment mark 12 is corresponding to the overlay mark 13 in a predetermined axis (i.e., X axis or Y axis in the embodiments) so that the positions of the overlay mark 13 can be measured and detected errors related to the positions of the alignment mark 12. Therefore, the errors of exposed positions of a pre-layer 20 and a current layer 30 can be determined. In other words, the alignment mark 12 formed on the pre-layer 20 performed as a reference of the overlay mark 13 of the current layer 30 so as to simplify the process and reduce the unnecessary occupation of wafer.

Please refer to FIG. 1; a plurality of shot region 11 is formed by an exposure equipment to perform a photolithographic process on the wafer 10. As shown in FIG. 1A, the alignment mark 12 of the integrated alignment and overlay mark is formed in a shot region 11 on the pre-layer 20. In the embodiment, the alignment mark 12 includes a first alignment pattern 121 and a second alignment pattern 122 respectively to conduct the alignment in the first and the second axes. For example, the first alignment pattern 121 is conducted to determine the X-axis alignment accuracy of photolithography (i.e., the first axis) and the second alignment pattern 122 is conducted to determined the Y-axis alignment accuracy of photolithography (i.e., the second axis). In detail, the first alignment pattern 121 can have a plurality of first parallelly-linear alignment patterns 1211; similarly, the second alignment pattern 122 can have a plurality of second parallelly-linear alignment patterns 1221. As shown in FIG. 1A, the first alignment pattern 121 includes three groups of first parallelly-linear alignment patterns 1211, and the second alignment pattern 122 includes three groups of second parallelly-linear alignment patterns 1221. Moreover, the first and second parallelly-linear alignment patterns 1211, 1221 are, but not restricted to, formed by embodying the designed mask pattern on a mask for use in a lithographic projection apparatus.

Please refer to FIG. 1B; an overlay mark 13 of the integrated alignment and overlay mark is formed on the current layer 30, and the alignment mark 12 and the overlay mark 13 are located on the same shot region 11. Moreover, the overlay mark 13 is formed inside the alignment mark 12. In the embodiment, the overlay mark 13 includes a first overlay pattern 131 and a second overlay pattern 132. Therefore, the measurements of orientation and/or gap between the first overlay pattern 131 and the first alignment pattern 121 in X-axis are made to determine the error values of the exposed position of the pre-layer 20 and the exposed position of the current layer 30 in X-axis (i.e., the first axis) fall within the predetermined error range or not. Similarly, the measurements of orientation and/or gap between the second overlay pattern 132 and the second alignment pattern 122 in Y-axis are made to determine the error values of the exposed position of the pre-layer 20 and the exposed position of the current layer 30 in Y-axis (i.e., the second axis) fall within the predetermined error range or not. In more detail, the first overlay pattern 131 includes a plurality of first parallelly-linear overlay patterns 1311 and the second overlay pattern 132 includes a plurality of second parallelly-linear overlay patterns 1321. As shown in FIG. 1B, the first overlay pattern 131 and the second overlay pattern 132 respectively include one group of the first parallelly-linear overlay patterns 1311 and one group of the second parallelly-linear overlay patterns 1321. The first parallelly-linear overlay patterns 1311 and the second parallelly-linear overlay patterns 1321 are, but not restricted to, formed by embodying the designed mask pattern on a mask for use in a photolithographic projection apparatus.

For analyzing the exposed error of the pre-layer 20 and the current layer 30, the overlay mark 13 of the integrated alignment formed on the current layer 30 and the alignment mark 12 of the integrated alignment formed on the pre-layer 20 are used in the following example. The first and second parallelly-linear alignment patterns 1211, 1221 of the alignment mark 12 on the pre-layer 20 can be used to define a first frame 123, and the first and the second parallelly-linear overlay patterns 1311, 1321 of the overlay mark 13 on the current layer 30 can be used to define a second frame 133. Therefore, the orientation and/or gap between the first frame 123 and the second frame 133 can be analyzed to determine the errors of exposed positions of a pre-layer 20 and a current layer 30 and further to determine the alignment accuracy of photolithography process between the pre-layer 20 and the current layer 30.

The three groups of the first parallelly-linear alignment patterns 1211 can be used to define two vertical lines of the first frame 123, and the one group of the first parallelly-linear overlay patterns 1311 can be used to define two vertical lines of the second frame 133. Therefore, the measurements of orientation and/or gap between the two vertical lines of the first frame 123 and the two vertical lines of the second frame 133 in X-axis are made for determining the error values falls within the predetermined error range or not. If the error values falls outside the predetermined error range, the exposed positions of the current layer 30 misaligns with the exposed positions of the pre-layer 20 in X-axis. Furthermore, the exposing parameter in X-axis has to be adjusted according to a correction factor analyzed from the error values.

In the same manner, the three groups of the second parallelly-linear alignment patterns 1221 can be used to define two horizontal lines of the first frame 123, and the one group of the second parallelly-linear overlay patterns 1321 can be used to define two horizontal lines of the second frame 133. Therefore, the measurements of orientation and/or gap between the two horizontal lines of the first frame 123 and the two horizontal lines of the second frame 133 in Y-axis are made for determining the error values falls within the predetermined error range or not. If the error values falls outside the predetermined error range, the exposed positions of the current layer 30 misaligns with the exposed positions of the pre-layer 20 in Y-axis. Furthermore, the exposing parameter of the exposure equipment in Y-axis has to be adjusted according to a correction factor analyzed from the error values.

Accordingly, the method of the present invention includes steps of forming an alignment mark 12 of the integrated alignment and overlay mark on the pre-layer 20; forming an overlay mark 13 of the integrated alignment and overlay mark on the current layer 30 and positioning the alignment mark 12 and the overlay mark 13 in the same shot region 11; and then analyzing the information of the overlay mark 13 relative to the information of the alignment mark 12 to determine the alignment accuracy between the pre-layer 20 and a current layer 30. In the detail, first positions/orientations on a first axis of the alignment mark 12 (i.e., the positions/orientations of the two vertical lines defined by the first frame 123), and first positions/orientations on a second axis of the alignment mark 12 (i.e., the positions/orientations of the two horizontal lines defined by the first frame 123) are measured. Then, second positions/orientations on the first axis of the overlay mark 13 (i.e., the positions/orientations of the two vertical lines defined by the second frame 133), and a second position on the second axis of the overlay mark 13 (i.e., the positions/orientations of the two horizontal lines defined by the second frame 133). Next step is comparing the first positions/orientations and the second positions/orientations on the first axis to determine the error values therebetween falls within the error range or not; comparing the first positions/orientations and the second positions/orientations on the second axis to determine the error values falls within the determined error range or not. If the compared results on the first and the second axes fall within the determined accepted error range, the current layer 30 aligns with the pre-layer 20 in the first and the second axes. On the contrary, one of or both of the compared results falls outside the determined accepted error range, a correction factor is provided in a feedback step to the exposure equipment in order to align the current layer 30 and the pre-layer 20.

Figure 1C:
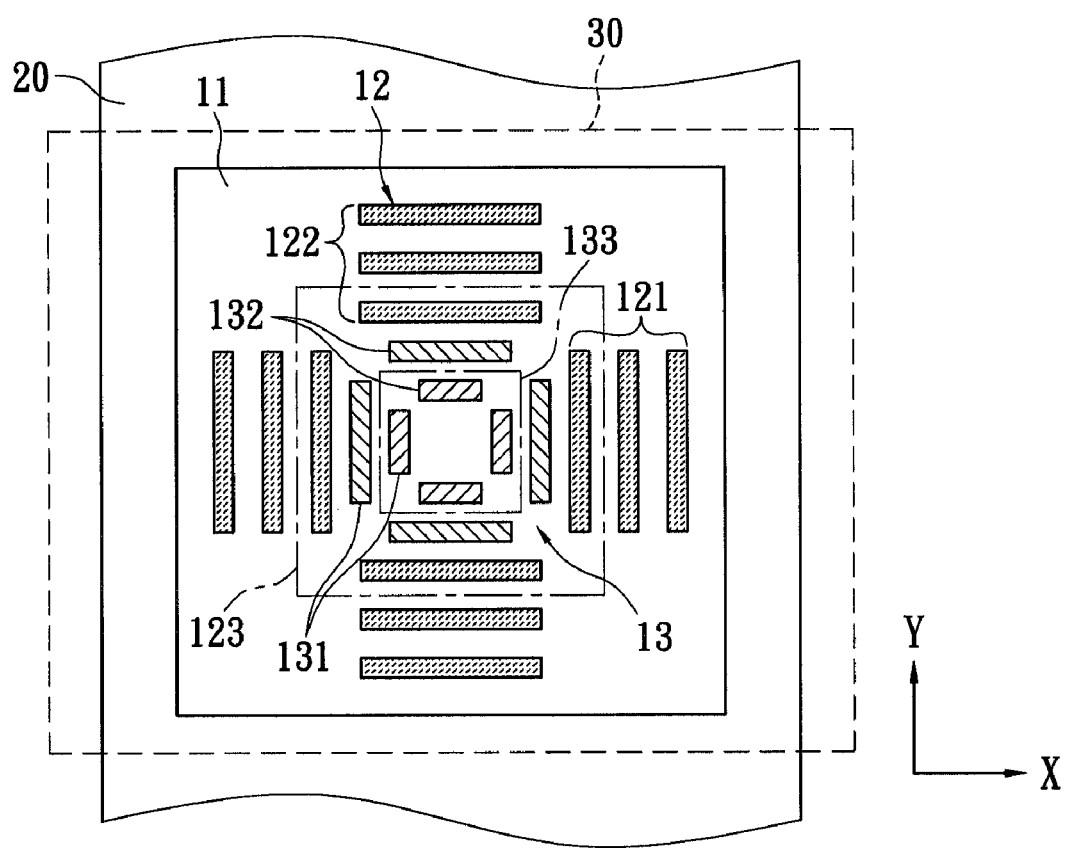
FIG. 1C showing another pattern structure of the first embodiment according to the present invention.

Please refer to FIG. 1C; comparing FIG. 1B, the first overlay pattern 131 and the second overlay pattern 132 respectively include two groups of the first parallelly-linear overlay patterns 1311 and two groups of the second parallelly-linear overlay patterns 1321. The two groups of the first parallelly-linear overlay patterns 1311 and the second parallelly-linear overlay patterns 1321 can similarly be defined as another second frame 133. Therefore, the alignment accuracy can be determined by comparing the positions/orientations of the first and the second frame 123, 133.

Figure 2A:
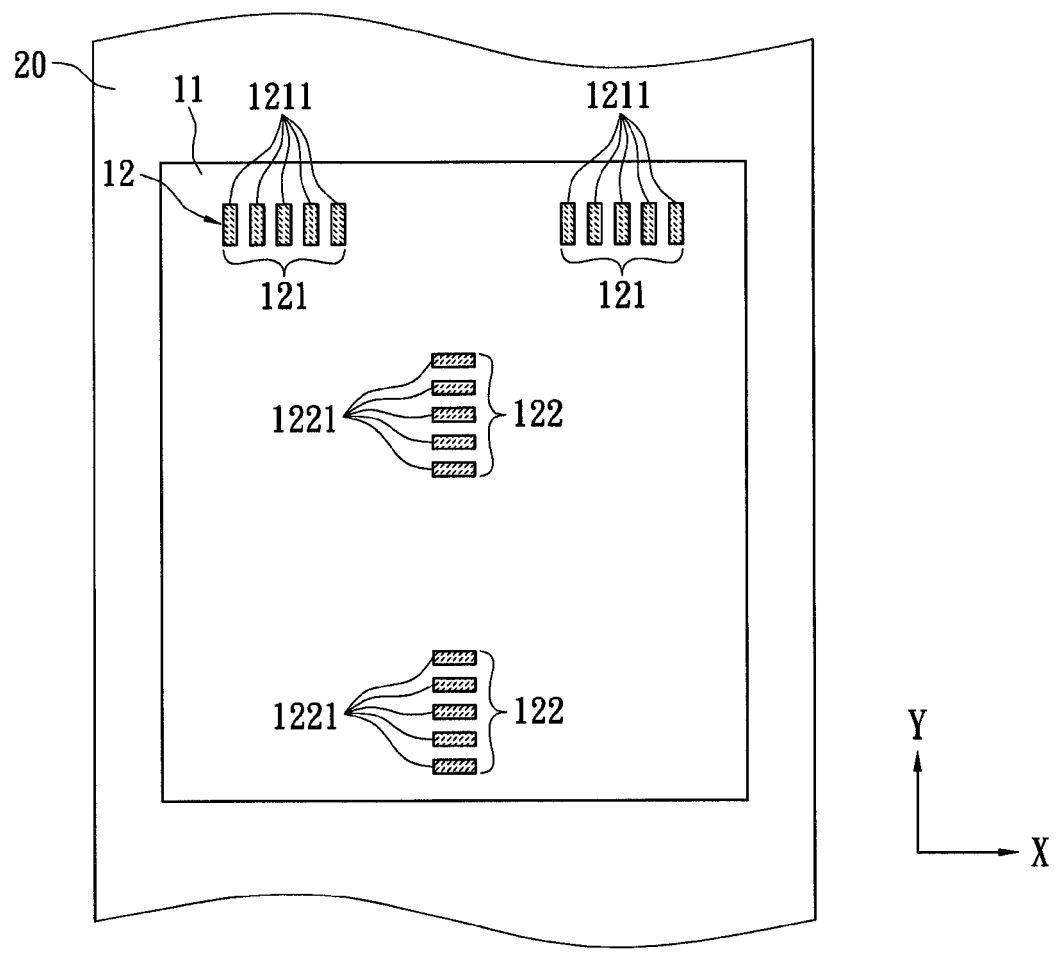
FIG. 2A showing the second embodiment of an alignment mark of the integrated alignment and overlay mark on the pre-layer according to the present invention.
Figure 2B:
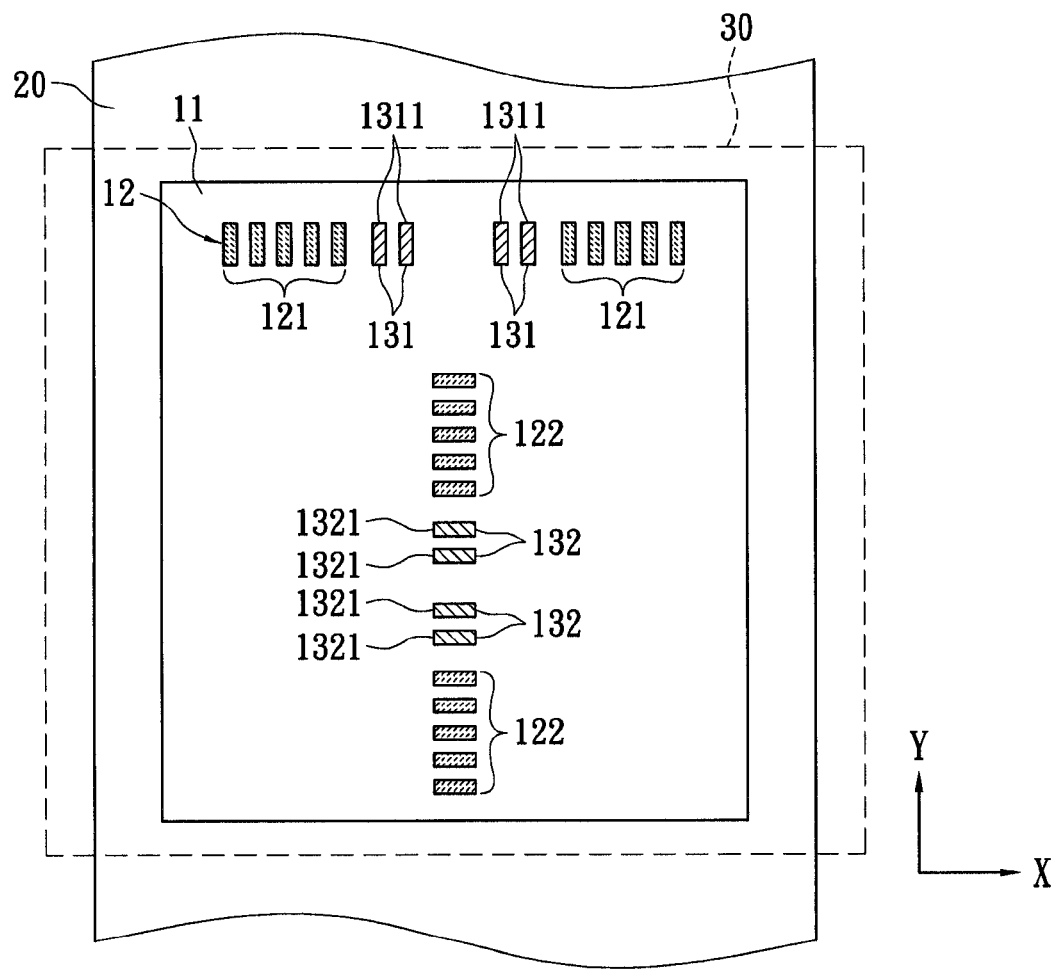
FIG. 2B showing the second embodiment of an overlay mark of the integrated alignment and overlay mark on the pre-layer according to the present invention.

Please refer to FIGS. 2A, 2B; the second embodiment is shown. The first alignment pattern 121 and a second alignment pattern 122 are separated from each other so that the first alignment pattern 121 can be independently used to analyze the accuracy of X-axis and the second alignment pattern 122 can be independently used to analyze the accuracy of Y-axis. The first overlay pattern 131 and the second overlay pattern 132 respectively formed inside the first alignment pattern 121 and a second alignment pattern 122. Therefore, the positions/orientations of the middle line defined by the first alignment pattern 121 can be compared with the positions/orientations of the middle line defined by the first overlay pattern 131 to determine the alignment accuracy in X-axis. In the case that the error values of the middle line defined by the first overlay pattern 131 and the middle line defined by the first alignment pattern 121 fall within the predetermined error range, the exposed positions of the current layer 30 align with that of the pre-layer 20. In the contrary case, the exposed positions of the current layer 30 misalign with that of the pre-layer 20 and the exposing parameter of the exposure equipment has to be adjusted. Similarly, the positions/orientations of the middle line defined by the second alignment pattern 122 and the positions/orientations of the middle line defined by the second overlay pattern 132 can be compared to determine the alignment accuracy in Y-axis.

In summary, the alignment mark 12 of the integrated alignment and overlay mark and the overlay mark 13 of the integrated alignment and overlay mark are formed in the same shot region 11 so as to reduce the area occupied by the individual alignment mark 12 and overlay mark 13. Moreover, the overlay mark 13 on the current layer 30 can be compared with the alignment mark 12 on the pre-layer 20 to determine the alignment accuracy of different axes. A feedback step for providing a feedback signal to the exposure equipment a correction factor is further provided when the current layer 30 misaligns with the pre-layer 20.

The text set forth hereinbefore illustrates, simply, the preferred embodiments of the present invention, rather than intending to restrict the scope of the present invention claimed to be legally protected. All effectively equivalent changes made by using the contents of the present disclosure and appended drawings thereof are included within the scope of the present invention delineated by the following claims.

What is claimed is:

1. A method for detecting errors of exposed positions of a pre-layer and a current layer by an integrated alignment and overlay mark, the method comprising steps of:

forming an alignment mark of the integrated alignment and overlay mark on the pre-layer, and the alignment mark being formed in a shot region;

forming an overlay mark of the integrated alignment and overlay mark on the current layer, and the overlay mark being formed in the shot region and inside the alignment mark; and making measurements of orientation and/or gap between the alignment mark and the overlay mark for detecting errors of exposed positions of the pre-layer and the current layer;

wherein the step of making measurements of orientation and/or gap between the alignment mark and the overlay mark further includes steps of:

making measurements of a first position on a first axis of the alignment mark, and a first position on a second axis of the alignment mark, making measurements of a second position on the first axis of the overlay mark, and a second position on the second axis of the overlay mark; and determining values of an error of the first position of the first axis and the second position of the first axis relative to a first predetermined error range, and determining values of an error of the first position of the second axis and the second position of the second axis relative to a second predetermined error range.

2. The method according to claim 1, wherein in the step of forming an alignment mark of the integrated alignment and overlay mark on the pre-layer, a first alignment pattern and a second alignment pattern are formed, and the first and the second alignment patterns are constructed as a first frame.

3. The method according to claim 2, wherein the first alignment pattern includes a plurality of first parallelly-linear alignment patterns, and the second alignment pattern includes a plurality of second parallelly-linear alignment patterns.

4. The method according to claim 3, wherein in the step of forming an overlay mark of the integrated alignment and overlay mark on the current layer, the overlay mark includes a first overlay pattern and a second overlay pattern, and the first and the second overlay patterns are constructed as a second frame, and the second frame is disposed inside the first frame.

5. The method according to claim 4, wherein the first overlay pattern includes a plurality of first parallelly-linear overlay patterns, the second overlay pattern includes a plurality of second parallelly-linear overlay patterns, the first parallelly-linear overlay patterns are parallel to the first parallelly-linear alignment patterns, and the second parallelly-linear overlay patterns are parallel to the second parallelly-linear alignment patterns.

6. The method according to claim 1, wherein in the step of forming an alignment mark of the integrated alignment and overlay mark on the pre-layer, a first alignment pattern and a second alignment pattern are formed, and the first and the second alignment patterns are separated from each other.

7. The method according to claim 6, wherein the first alignment pattern includes a plurality of first parallelly-linear alignment patterns, and the second alignment pattern includes a plurality of second parallelly-linear alignment patterns.

8. The method according to claim 7, wherein in the step of forming an overlay mark of the integrated alignment and overlay mark on the current layer, the overlay mark includes a first overlay pattern and a second overlay pattern, and the first overlay pattern is disposed inside the first alignment pattern, and the second overlay pattern is disposed inside the second alignment pattern.

9. The method according to claim 8, wherein the first overlay pattern includes a plurality of first parallelly-linear overlay patterns, the second overlay pattern includes a plurality of second parallelly-linear overlay patterns, the first parallelly-linear overlay patterns are parallel to the first parallelly-linear alignment patterns, and the second parallelly-linear overlay patterns are parallel to the second parallelly-linear alignment patterns.

10. The method according to claim 1, further comprising a feedback step for providing a feedback signal to the exposure equipment a correction factor if the values of an error of the first position of the first axis and the second position of the first axis fall outside the first predetermined error range, and/or the values of an error of the first position of the second axis and the second position of the second axis fall outside the second predetermined error range after the step of determining values of the error.

* * * * *